(12) United States Patent
Ushitani et al.

(10) Patent No.: US 7,683,372 B2
(45) Date of Patent: Mar. 23, 2010

(54) SEMICONDUCTOR APPARATUS AND METHOD FOR MANUFACTURING THE SAME

(75) Inventors: Hitomi Ushitani, Shinagawa (JP); Shou Nagao, Tochigi (JP); Tomoyuki Iwabuchi, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 0 days.

(21) Appl. No.: 12/219,377

(22) Filed: Jul. 21, 2008

(65) Prior Publication Data
US 2009/0039430 A1 Feb. 12, 2009

Related U.S. Application Data

(62) Division of application No. 10/690,840, filed on Oct. 23, 2003, now Pat. No. 7,405,111.

(30) Foreign Application Priority Data

Oct. 24, 2002 (JP) ............................. 2002-309600

(51) Int. Cl.
*H01L 31/00* (2006.01)
(52) U.S. Cl. ........................................ 257/59
(58) Field of Classification Search ................... 257/59
See application file for complete search history.

(56) References Cited

U.S. PATENT DOCUMENTS

| 5,300,454 | A | 4/1994 | Taft et al. |
|---|---|---|---|
| 5,892,235 | A | 4/1999 | Yamazaki et al. |
| 6,335,942 | B1 | 1/2002 | Huang et al. |
| 6,458,430 | B1 | 10/2002 | Bernstein et al. |
| 6,459,124 | B1 | 10/2002 | Zhang et al. |
| 6,528,360 | B2 | 3/2003 | Zhang et al. |
| 6,531,713 | B1 * | 3/2003 | Yamazaki ..................... 257/59 |
| 6,703,643 | B2 | 3/2004 | Yamazaki et al. |

(Continued)

FOREIGN PATENT DOCUMENTS

JP 55-134929 A 10/1980

(Continued)

OTHER PUBLICATIONS

J. Chen et al., *Electron Density and Energy Distributions in the Positive DC Corona: Interpretation for Corona-Enhanced Chemical Reactions*, Plasma Chemistry and Plasma Processing, vol. 22, No. 2, Jun. 2002, pp. 199-224.

(Continued)

*Primary Examiner*—Bradley K Smith
(74) *Attorney, Agent, or Firm*—Eric J. Robinson; Robinson Intellectual Property Law Office, P.C.

(57) ABSTRACT

The present invention is to carry out stable doping and to prevent the drastic pressure change in a treatment chamber by reducing degasification of resist during adding impurities. In the present invention, the stability of the impurity ion injection can be ensured by reducing degasification of resist by reducing the area (resist area proportion, that is, the ratio of the area of resist to the whole area of a substrate) of resist pattern which is used depending on the conditions such as acceleration voltage or current density of a doping process.

18 Claims, 13 Drawing Sheets

U.S. PATENT DOCUMENTS

| | | |
|---|---|---|
| 7,126,161 B2 | 10/2006 | Yamazaki |
| 2002/0045302 A1* | 4/2002 | Zhang et al. ................ 438/199 |
| 2003/0232465 A1 | 12/2003 | Hayakawa |
| 2005/0011455 A1 | 1/2005 | Yamamoto et al. |

FOREIGN PATENT DOCUMENTS

| | | |
|---|---|---|
| JP | 59-175722 A | 10/1984 |
| JP | 61-081621 A | 4/1986 |
| JP | 01-206662 A | 8/1989 |
| JP | 05-055159 | 3/1993 |
| JP | 07-296763 A | 11/1995 |
| JP | 11-074215 A | 3/1999 |
| JP | 2000-011942 A | 1/2000 |
| JP | 2001-267266 | 9/2001 |

OTHER PUBLICATIONS

Richard C. Jaeger "Introduction to Microelectronic Fabrication" vol. 5, 1993, pp. 18-19, 91-95.

* cited by examiner

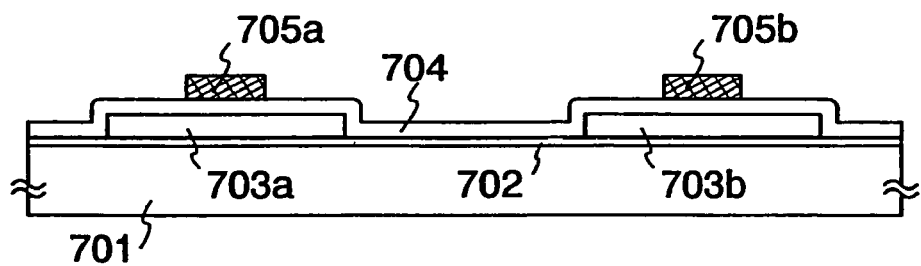
FIG. 7A
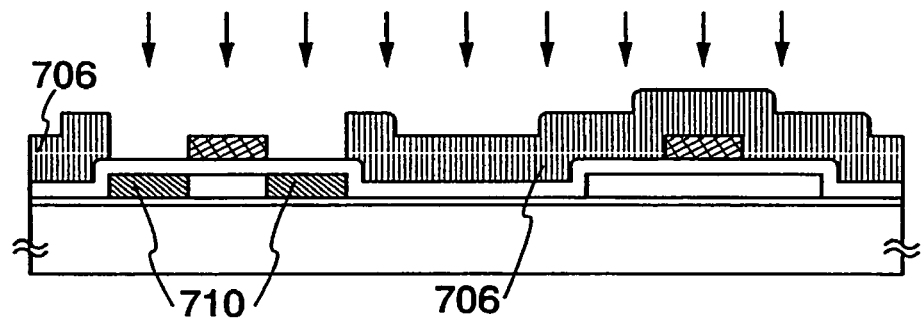
FIG. 7B  Adding N-type Impurity Element (Phosphorus Doping)
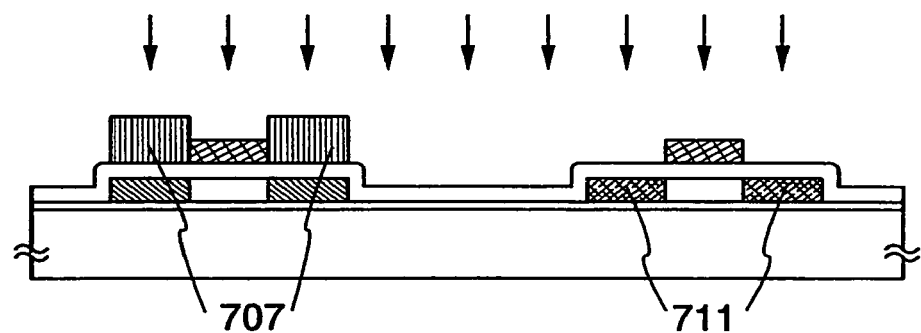
FIG. 7C  Adding P-type Impurity Element (Boron Doping)
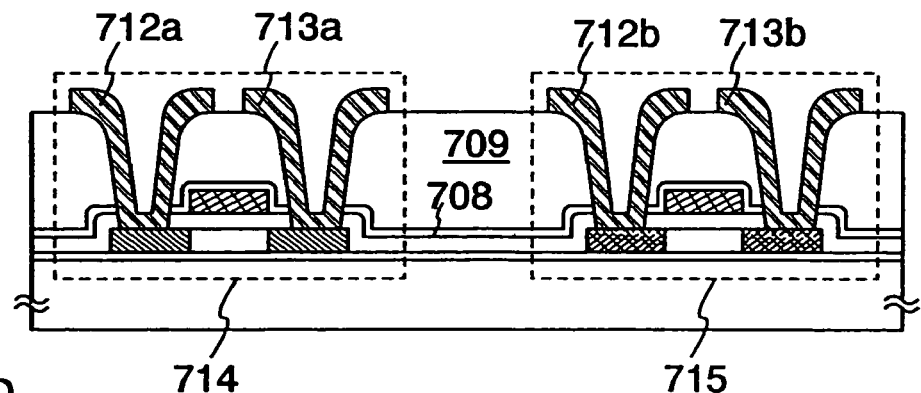
FIG. 7D

Mask Pattern for Adding N-type Impurity Elements

Mask Pattern for Adding P-type Impurity Elements

Condition after Carrying out Doping

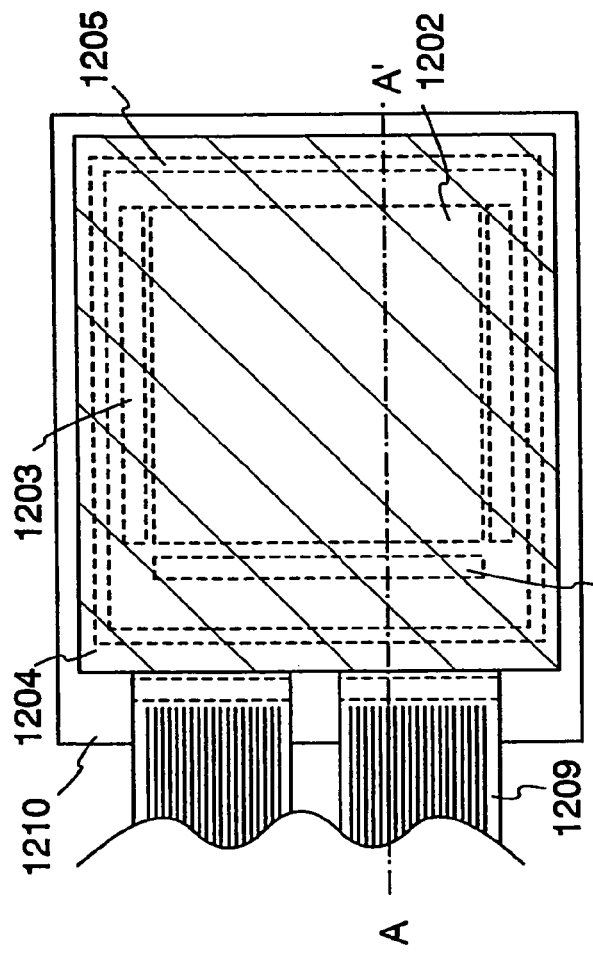
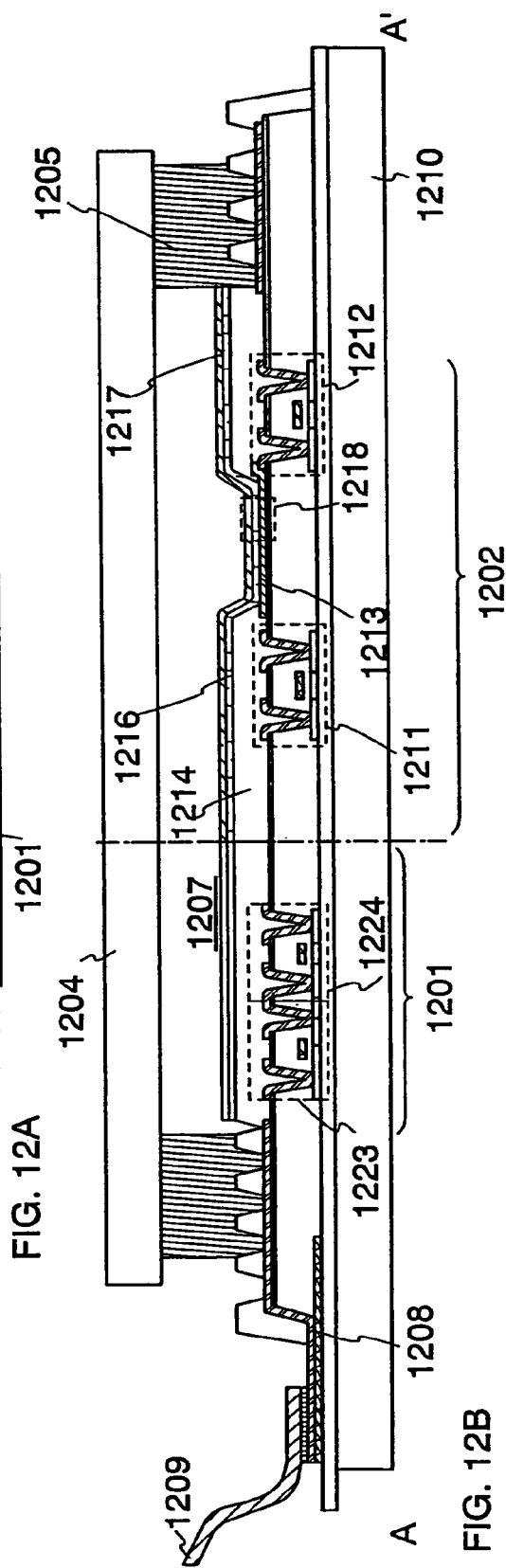
FIG. 12A
FIG. 12B

SEMICONDUCTOR APPARATUS AND METHOD FOR MANUFACTURING THE SAME

BACKGROUND OF THE INVENTION

1. Field of the Invention

The present invention relates to a method for manufacturing a semiconductor apparatus. More specifically the present invention relates to technique for adding conductive impurities to a semiconductor over a substrate.

2. Related Art

In case of forming an impurity region such as a source or a drain region that is a component of a thin film transistor (TFT), various methods for adding impurities are adopted.

As a method for adding impurities, for example, ion implantation, ion doping, or the like is utilized. The ion implantation is the technique, that is, elements such as boron (B), phosphorus (P), or the like is ionized and mass-separated, then, only necessary ions are accelerated by an electric field, and then, doped to a semiconductor such as silicon. The ion doping is the technique, that is, ions are accelerated by an electric field and doped without mass separation.

In case of utilizing such technique, only desired regions can be added with impurities by means of masking the region where doping is not wanted to be carried out.

However, there are problems that resist which is generally used as a mask is degassed by ion beam irradiation, due to this, pressure in a treatment chamber is increased, and so ion beam becomes impossible to be irradiated, an injection amount of impurities has a margin of error, or the like.

As technique for reducing degasification of resist, it is known that heating resist previously to remove degasification during doping (See Reference 1: Unexamined Patent Publication No. 5-55159).

SUMMARY OF THE INVENTION

In view of the foregoing, it is an object of the present invention is to carry out stable doping and to prevent the drastic pressure change in a treatment chamber by reducing degasification of resist during adding impurities.

In the present invention, the stability of the impurity ion injection is ensured by reducing degasification of resist by reducing the area (resist area proportion, that is, the ratio of the area of resist to the whole area of a substrate) of resist pattern which is used depending on the conditions such as acceleration voltage or current density of a doping process.

Therefore, one of the constitutions of the present invention is: a method for manufacturing a semiconductor apparatus comprising the steps of:

forming a semiconductor over a substrate;

forming a mask formed of resist over the semiconductor to overlap with a portion of the semiconductor and heating the resulted mask; and adding an impurity element by a doping method;

wherein an area of the mask is smaller than that of a mask which has an opening only in an impurity element doped region and in an adjusting margin over the semiconductor.

In the above-described constitution, the term "the adjusting margin" refers to a portion for misalignment of the mask when adding impurity elements on the semiconductor. Specifically, it is preferable that the distance from the edge of the semiconductor to the edge of the adjusting margin be at most 10 µm.

In the above constitution, it is preferable that the area of mask be at most 35% of the area of substrate in case of reducing the area of the mask. Especially, it produces great effects in case of doping with the acceleration voltage of 80 kV.

In the above constitution, it is preferable that the area of mask be formed to be at most 15% of the area of substrate in case that the mask is not heated.

In the above constitution, it is preferable that the area of the mask be formed to be at most 35% of the area of substrate in case of doping with the acceleration voltage of 80 kV and the current density at least 540 µA/cm, however, it is preferable that the area of mask be formed to be at most 40% in case doping with the current density of 450 µA/cm.

In the above constitution, it is preferable that the area of mask be at most 40% in case of doping with the acceleration voltage of 80 kV and the current density of at most 450 µA/cm.

In addition, the amount of degassed gas increases not only when increasing the current density but also when increasing the acceleration voltage during doping. Therefore, as one of probable cases, the current density and the acceleration voltage of either impurity elements are increased in case that n-type impurity elements (phosphorus, etc.) and p-type impurity elements (boron, etc.) are added by ion implantation.

For example, in case of increasing the current density or the acceleration voltage at ion-implanting of the p-type impurity elements than those of the n-type impurity elements, it is necessary that an area of resist which is used for adding the p-type impurity elements is smaller than that for adding the n-type impurity elements. Specifically, it is preferable that the resist area proportion be at most 20% in case that the p-type impurity elements are added by ion implantation with the acceleration voltage of 60 kV and the current density of 15 µA/cm$^2$, whereas it is preferable that the resist area proportion be at most 15% in case that the n-type impurity elements are added by ion implantation with the acceleration voltage of 80 kV and the current density of 15 µA/cm$^2$.

Therefore, the constitution of the present invention in such a case is: a method for manufacturing a semiconductor apparatus comprising the steps of:

forming a semiconductor over a substrate;

forming a gate electrode over the semiconductor via an insulating film;

forming a first mask formed of resist in a position to overlap with a portion of the semiconductor;

adding an n-type impurity element by a doping method with current density of at least 15 µA/cm$^2$ and with acceleration voltage of at least 60 kV;

removing the first mask;

forming a second mask formed of resist in a position to overlap with a portion of the semiconductor, and adding a p-type impurity element by a doping method with current density of at least 15 µA/cm$^2$ and with acceleration voltage of at least 80 kV;

wherein an area of the first mask is at most 20% of an area of the substrate, and an area of the second mask is at most 15% of an area of the substrate.

The present invention includes not only the structure that reduces an area of the resist but also that removes previously degasification of resist by heating the substrate before carrying out doping.

Thus, the constitution of the present invention in such a case is: a method for manufacturing a semiconductor apparatus comprising the steps of:

forming a semiconductor over a substrate;

forming a gate electrode over the semiconductor via an insulating film;

forming a first mask formed of resist in a position to overlap with a portion of the semiconductor and heating the resulted first mask;

adding an n-type impurity element by a doping method with current density of at least 15 µA/cm² and with acceleration voltage of at least 60 kV;

removing the first mask;

forming a second mask formed of resist in a position to overlap with a portion of the semiconductor and heating the resulted second mask; and adding a p-type impurity element by a doping method with current density of at least 15 µA/cm² and with acceleration voltage of at least 80 kV;

wherein an area of the first mask is at most 40% of an area of the substrate, and an area of the second mask is at most 35% of an area of the substrate.

Further, the structure of a semiconductor apparatus manufactured by using the doping method according to the present invention is: a semiconductor apparatus including a plurality of an n-channel TFT or a p-channel TFT over a substrate, comprising:

an island like semiconductor including an n-type impurity region and an island like semiconductor including a p-type impurity region over the substrate;

an insulating film formed over the substrate to cover the island like semiconductor including the n-type impurity region and the island like semiconductor including the p-type impurity region; and a gate electrode formed to overlap a portion of the island like semiconductor including the n-type impurity region and a portion of the island like semiconductor including the p-type impurity region via the insulating film;

wherein an impurity concentration of the insulating film is lower than that of another region in a position which is overlapping with the n-type impurity region.

Also, the structure of a semiconductor apparatus manufactured by using the doping method according to the present invention is: a display device including a plurality of pixel portions, and a plurality of an n-channel TFT or a p-channel TFT over a substrate, comprising:

an island like semiconductor including an n-type impurity region and an island like semiconductor including a p-type impurity region over the substrate;

an insulating film formed over the substrate to cover the island like semiconductor including the n-type impurity region and the island like semiconductor including the p-type impurity region; and a gate electrode formed to overlap a portion of the island like semiconductor including the n-type impurity region and a portion of the island like semiconductor including the p-type impurity region via the insulating film;

wherein a part of the pixel portion contains a n-type impurity element and a p-type impurity element, wherein a ratio of the part of the pixel portion containing impurity element to the pixel portion is no less than 80%, wherein a concentration of the impurity element contained in a pixel part is the same grade as a TFT domain, wherein the impurity element can be contained in any of layers which the pixel part comprises.

In addition, this invention is suitable for use in a process of using a large size substrate. For example, the area of the substrate is no less than 1 square meter.

BRIEF DESCRIPTION OF THE DRAWINGS

FIGS. 7A to 7D are a view showing a doping method according to Embodiment Mode;

FIGS. 12A and 12B are a view showing a semiconductor apparatus; and

DESCRIPTION OF THE PREFERRED EMBODIMENTS

Hereinafter, the embodiment mode of the present invention will be described.

Embodiment Mode 1

In Embodiment Mode 1, the results of forming resist patterns each of which has different area proportion over a substrate and implanting ions over a substrate by a doping device. Here, after resists are formed, the resulted resist are heated at 200° C. for 2 hours. The doping device has the structure in which a substrate is scanned at plural times from an ion generator to the position where ions are implanted. Ions are implanted to one position at the same number of times as the number of scanning. Specific structure of the doping device will be described in Embodiment Mode 2, so that explanation thereof is omitted here.

Figure 1:
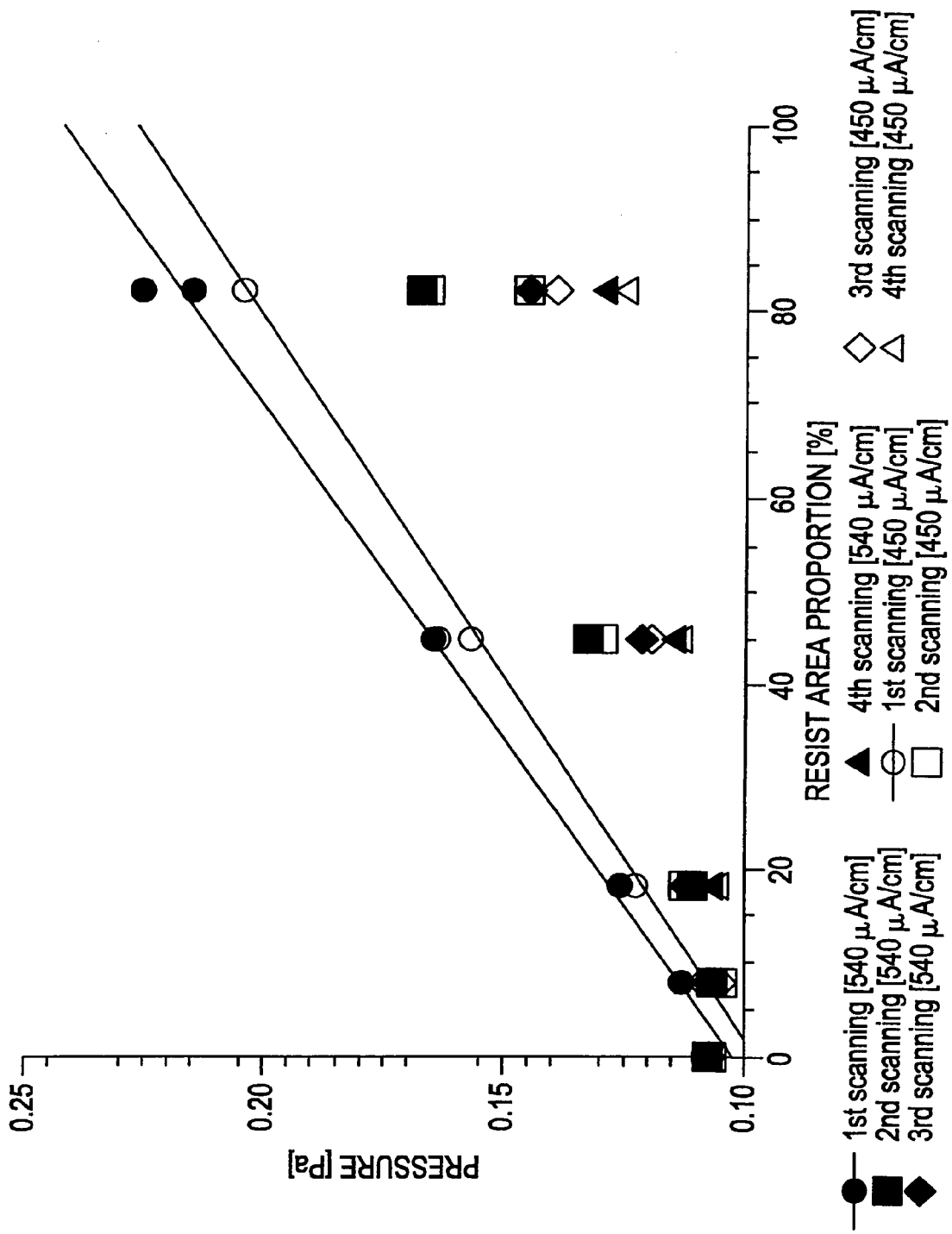
FIG. 1 is a graph showing degrees of vacuum with changes in the ratio of a resist area.

Firstly, the measurement of the pressure inside a treatment chamber (a doping chamber) during ion implantation gives the results that the pressure inside the treatment chamber is decreased according to decreasing the resist area proportion (%) as shown in FIG. 1 (especially at the first scanning). FIG. 1 shows that the pressure is measured from the first to the fourth scanning in case of implanting ions under the conditions of current density of 540 µA/cm and 450 µA/cm.

Figure 2:
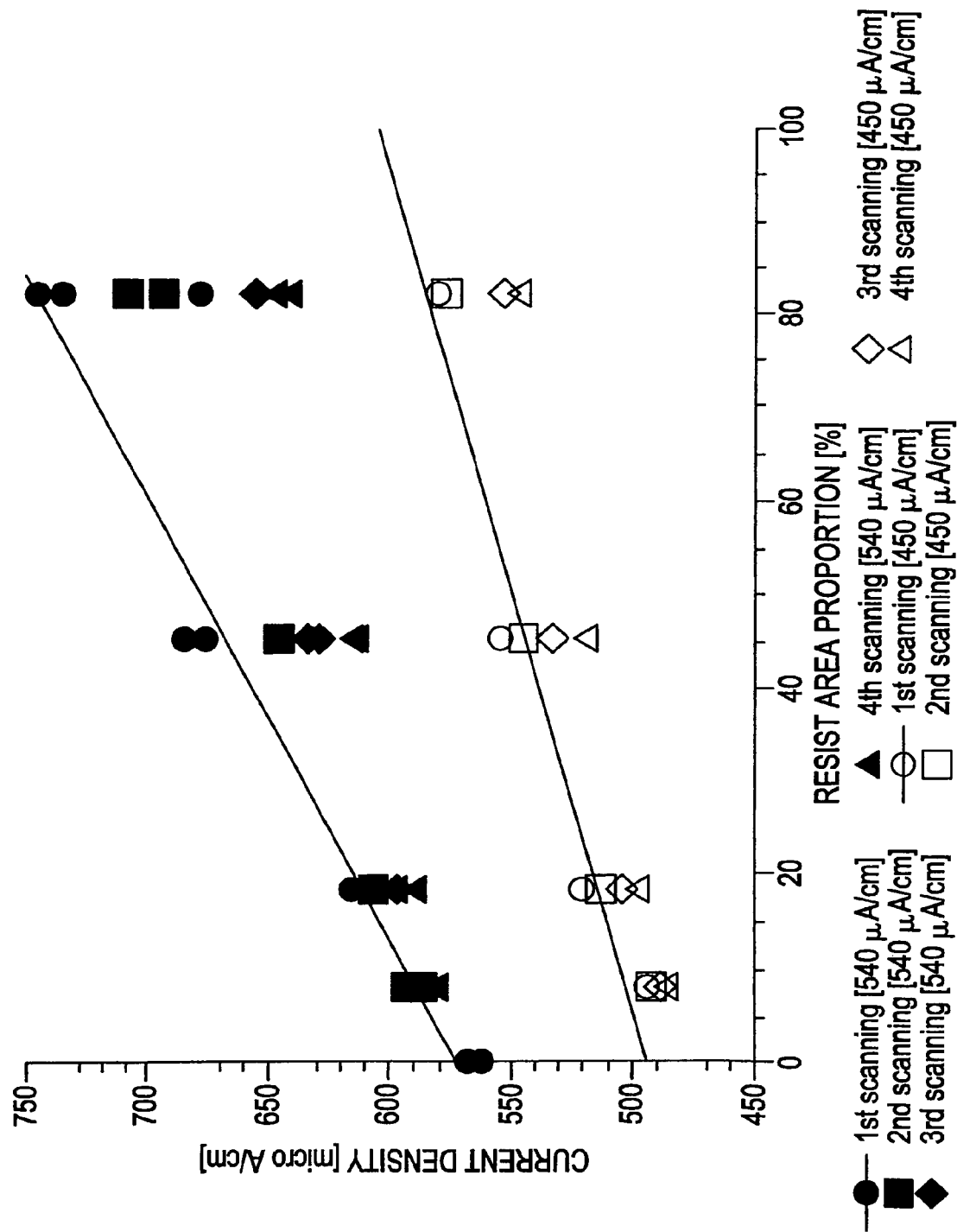
FIG. 2 is a graph showing current density with changes in the ratio of a resist area.

Secondly, the maximum value at every scanning during ion implantation is measured. In addition, the stability of ion implantation during doping can be evaluated from the variation of the maximum value of current density. Similarly, the maximum value of the current density in every condition is measured by changing the resist area required. FIG. 2 shows the results. In addition, in any case of each current density (540 µA/cm and 450 µA/cm), the measurement shows the result that values between objective current density (540 µA/cm and 450 µA/cm) and actual maximum value of current density (especially, at the first scanning) are varied widely according to decreasing the resist area proportions (%). As shown in FIG. 2, ions are implanted in both cases of current density of 540 µA/cm and 450 µA/cm, and the maximum values of current density from the first to the fourth scanning are measured.

It is preferable that the variation of current density (maximum value) during doping be generally within 20%, so that it is preferable that the resist area proportions be at most 35% in case of acceleration voltage of 80 kV and current density of 540 μA/cm. Further, in case of acceleration voltage of 80 kV and current density of 450 μA/cm, it is preferable that the resist area proportions be at most 40%. Therefore, it is necessary that the resist area proportions are further reduced in such case that doping is carried out at high current density which makes resist be susceptible to be degassed. In addition, it is preferable that the resist area proportions be within 15% in case that the resist is not heated after forming the resist.

The pressure inside a treatment chamber can be at most 0.15 Pa as shown in FIG. 1 by setting the resist area proportions at most 35%. In addition, ions can be implanted without generating abnormal electrical discharge (arcing) inside the treatment chamber under this conditions.

Figure 3:
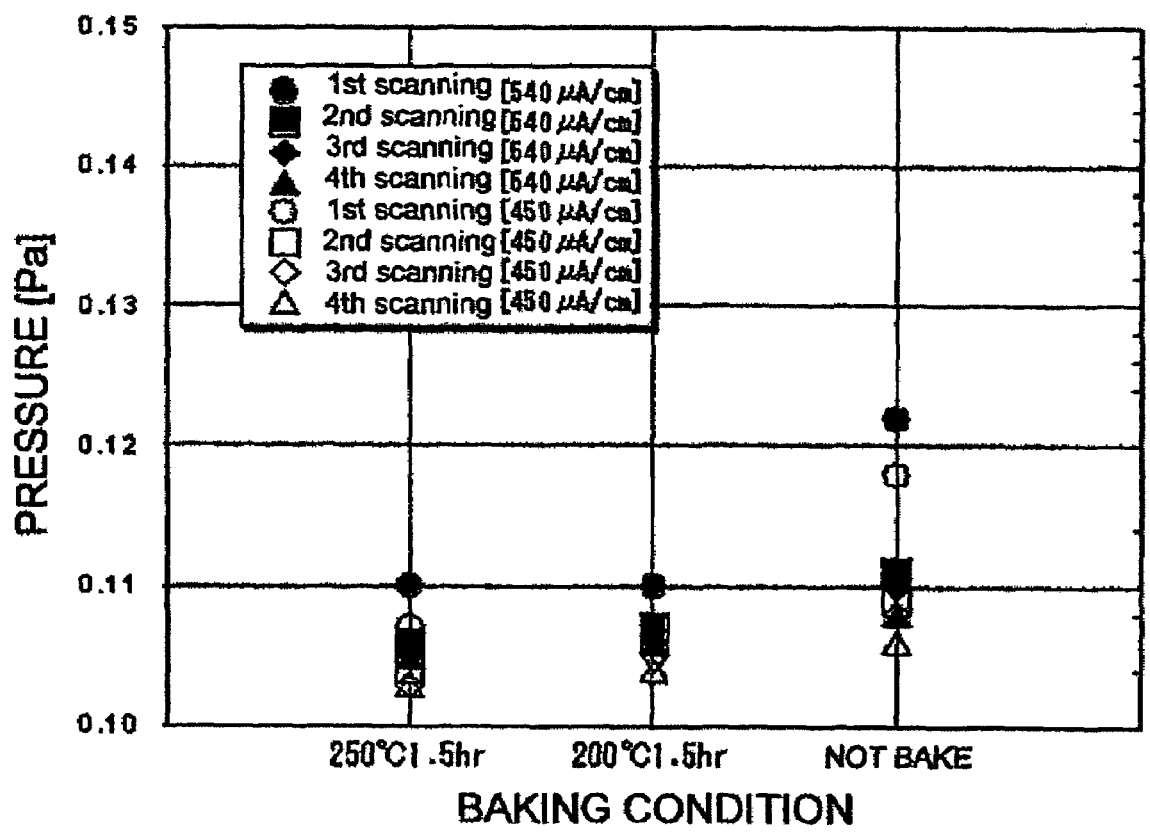
FIG. 3 is a graph showing degrees of vacuum with changes in baking conditions.
Figure 4:
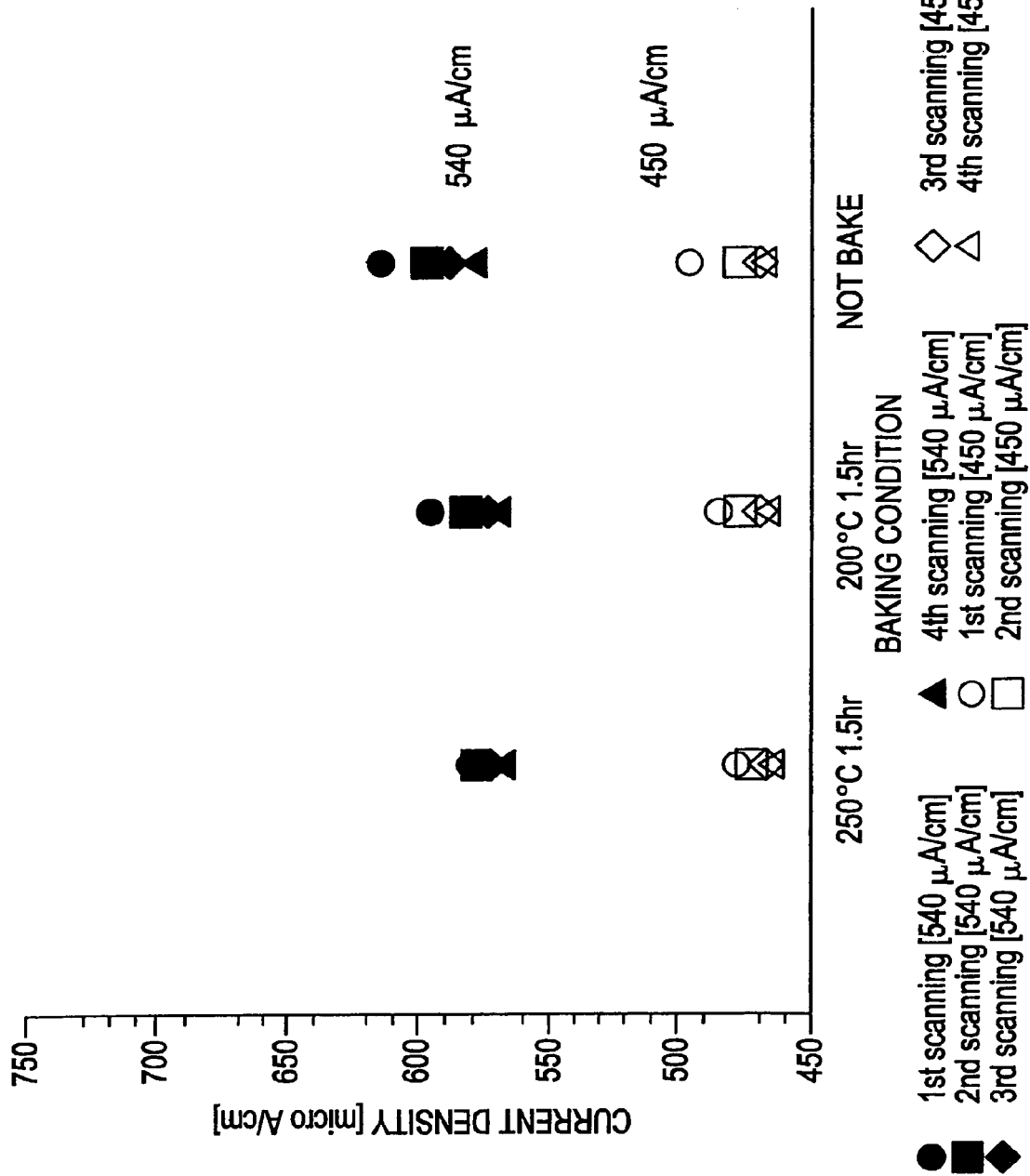
FIG. 4 is a graph showing degrees of vacuum with changes in baking conditions.

FIG. 3 is a view showing the measurement result of pressure inside the treatment chamber in case not only of reducing the resist area proportions but also heating a substrate previous to doping. FIG. 4 is a view of showing the measurement result of the maximum value of current density.

As shown in FIGS. 3 and 4, the measurements show that degasification of resist and variations of current density (maximum value) can be reduced by not only reducing resist area proportions but also heating a substrate previous to doping.

Figure 5:
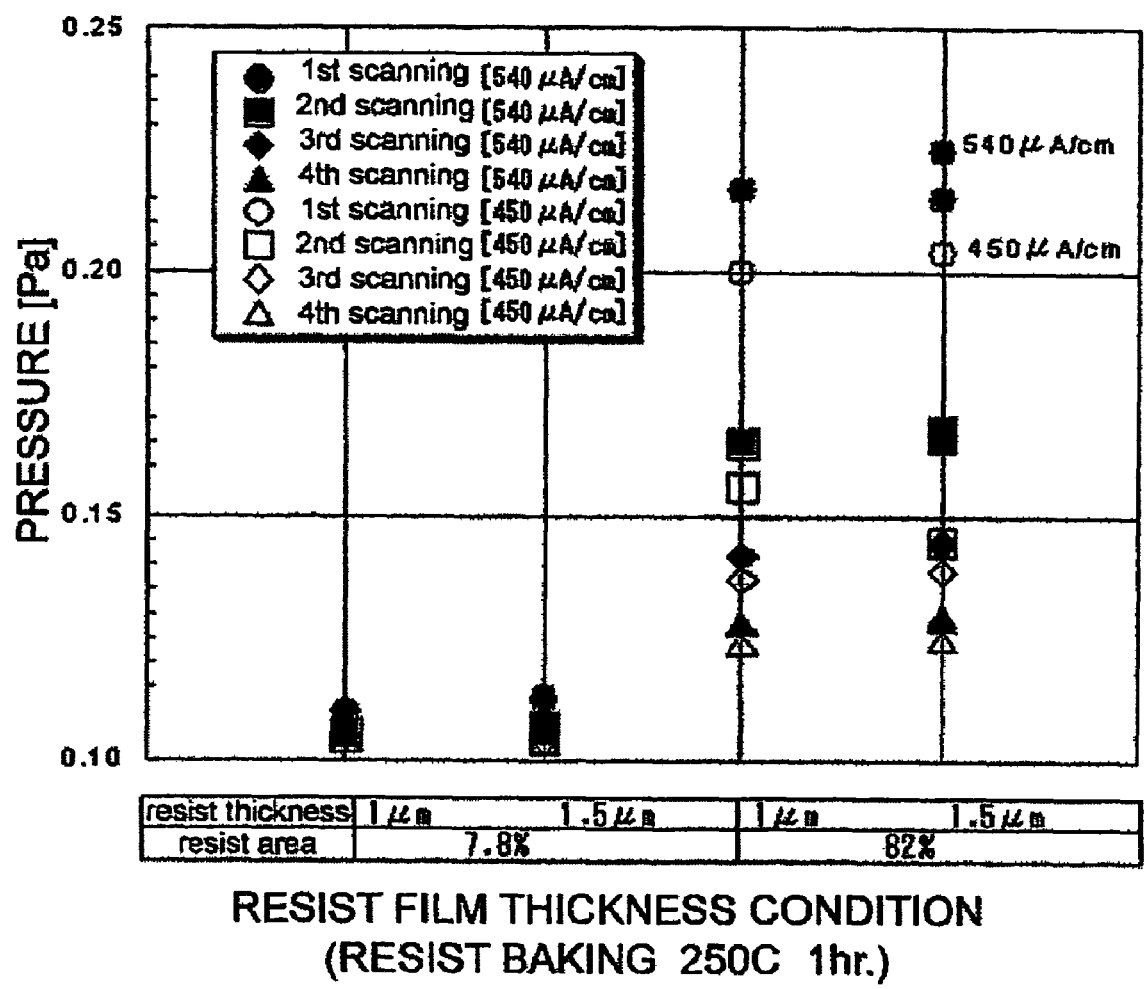
FIG. 5 is a graph showing degrees of vacuum with changes in thickness conditions.
Figure 6:
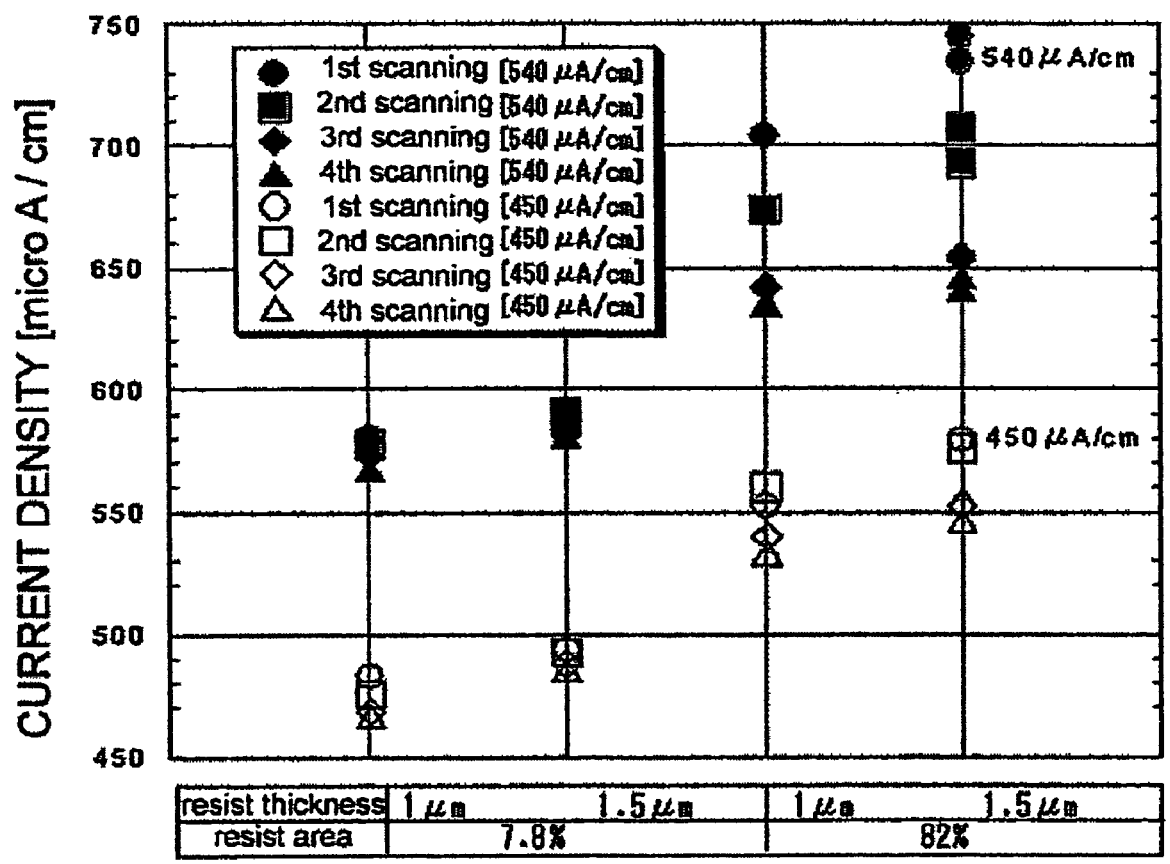
FIG. 6 is a graph showing current density with changes in thickness conditions.

FIG. 5 is a view showing the measurement result of the pressure inside a treatment chamber in case that the thicknesses of resist are different. FIG. 6 is a view showing the measurement result of the maximum value of current density.

As shown in FIGS. 3 and 4, the measurements show that degasification of resist and variations of current density (maximum value) can be reduced.

Embodiment Mode 2

In this embodiment mode, a method for doping according to the present invention will be described. The case that n-type impurity elements and p-type impurity elements are added respectively to one substrate by doping method using resist with minimal area proportions as a mask will be described.

In FIG. 7A, a base film 702 is formed to have a thickness of from 50 to 200 nm, which is formed of one kind or plural kinds selected from the group consisting of silicon nitride, silicon oxide, or silicon oxynitride, over a substrate 701 formed of glass, such as barium borosilicate glass or aluminum borosilicate, quartz, or the like, and semiconductor films 703a, 703b having shapes of islands are formed over the base film 702. In the present invention, a silicon substrate can be used for the substrate 701.

Next, a gate insulating film 704 is formed to have a thickness of 80 nm. The gate insulating film 704 is formed by plasma CVD or sputtering. A silicon oxynitride film formed of $SiH_4$ and $N_2O$ added with $O_2$ is preferable as a material for the gate insulating film 704 since the silicon oxynitride film 704 can be reduced the fixed charge density in the film. But not exclusively, the gate insulating film can be formed of a single insulating layer or a laminate insulating layer such as a silicon oxide film, a tantalum oxide fm, or the like.

Then, a conductive film is formed over the gate insulating film 704 to form and a gate electrodes 705a, 705b by dry etching with masks. In addition, there is no limitation of kinds of a conductive film used, conductive materials such as Al, Ta, Ti, W, Mo, or the like or alloys of these materials are utilized. As the structure of the gate electrodes 705a, 705b formed by using such materials, a lamination structure, for example, a tantalum nitride or titanium nitride/W or Mo—W alloy; W/Al or Cu; Ti/Al—Si/Ti; TaN/Ti, or the like is utilized. In case of using Al, from 0.1 to 7 atom % of Ti, Sc, Nd, Si, Cu, or the like is added to the Al for improving the heat resistance. Further, the conductive film is formed to have approximately a thickness of from 300 to 500 nm (FIG. 7A).

N-type impurity elements are added by ion implantation (here, ion implantation without mass separation is used). In this case, a first mask formed of resist is formed in order to implant n-type impurity elements (phosphorus) into the portion so as not to overlap with the gate electrode 705a of the semiconductor film 703a Phosphorus (dose amounts of $2\times10^{15}/cm^2$) is implanted under the conditions, that is, 20% of $PH_3$ is used as impurity gas; 15 μA/cm² of the current density; and 60 kV of the acceleration voltage. As shown in FIG. 7B, the first mask 706 is formed over not only over the semiconductor film 703b where p-type impurity elements are implanted in the following process but also over a part of the gate insulating film 704, however, there is no problem since the amount of degassed gas does not give adverse effects to the stability of doping in case of doping under such conditions of the current density and the acceleration voltage. It is preferable that the area proportions of the first mask 706 be at most 20%, whereas it is preferable that the area proportions of the first mask 706 be at most 40% in case that a mask is heated (for example, 200° C., 2 hours) after forming the mask and before doping.

After completing the phosphorus implantation, the first mask 706 is peeled off by ashing. The ashing is carried out in oxygen plasma and the resist can be peeled off for from 30 to 45 minutes.

Next, p-type impurity elements are added by ion implantation. In this case, a second mask 707 is formed in order to implant p-type impurity elements into the portion where the gate electrode 705b of the semiconductor film 703b is not overlapped. Boron (dose amounts of $8\times10^{15}/cm^2$) is implanted under the conditions, that is, $B_2H_6$ of 15% is used as impurity gas; the current density of 10 μA/cm²; and the acceleration voltage of 80 kV. As shown in FIG. 7C, the second mask 707 is formed to overlap only the semiconductor film 703a implanted with n-type impurity elements so as to control the area proportions of the second mask 707 are small as much as possible. The reason is that the amount of degasification gives adverse effects on the stability of doping under the condition of the current density and the acceleration voltage for adding p-type impurity elements. It is preferable that the area proportions of the second mask 707 be at most 15%, whereas it is preferable the area proportions of the second mask 707 be at most 35% in case that a mask is heated (for example, 200° C., 2 hours) after forming the mask and before doping.

After completing the boron implantation, the second mask 707 is peeled by ashing. The ashing is carried out in oxygen plasma and the resist can be peeled off for from 30 to 45 minutes.

Then, as shown in FIG. 7D, a first insulating film 708, which is formed of a silicon oxynitride film, a silicon nitride film, or a silicon nitride oxide film, is formed to have a thickness of 100 nm by plasma CVD.

Heat treatment is carried out for recovery and activation of crystallinity of semiconductor regions of n-type and p-type. The heat treatment can be carried out by rapid thermal annealing, laser annealing, or the like, in addition to furnace annealing oven. A second insulating film 709 is formed over the first insulating film 708. The second insulating film 709 may be formed by organic insulating materials (including photosensitive materials or nonphotosensitive materials) such as polyimide, acrylic, or the like, and flattened its surface. The thickness of the second insulating film 709 is from 0.5 to 1 μm.

Next, contact holes are formed on the insulating film 709 to reach impurity regions (an n-type impurity region 710, p-type impurity region 711) of each semiconductor film to form wirings using Al, Ti, Ta, or the like. In FIG. 7D, each reference numerals 712a, 712b, 713a, 713b is a source line (electrode) or a drain line (electrode). Thus, an n-channel type TFT 714 and a p-channel type TFT 715 can be formed. Although each TFT is illustrated as a unit here, these TFTs can be formed into a CMOS circuit, an NMOS circuit, or a PMOS circuit.

Therefore, in case that an n-channel TFT and a p-channel TFT are formed by adding each n-type or p-type impurity elements to one substrate, the stability of doping can be obtained by controlling the resist area proportions as much as small if doping is carried out under the conditions causing the problem of degasification of resist.

Embodiment Mode 3

Figure 8A:
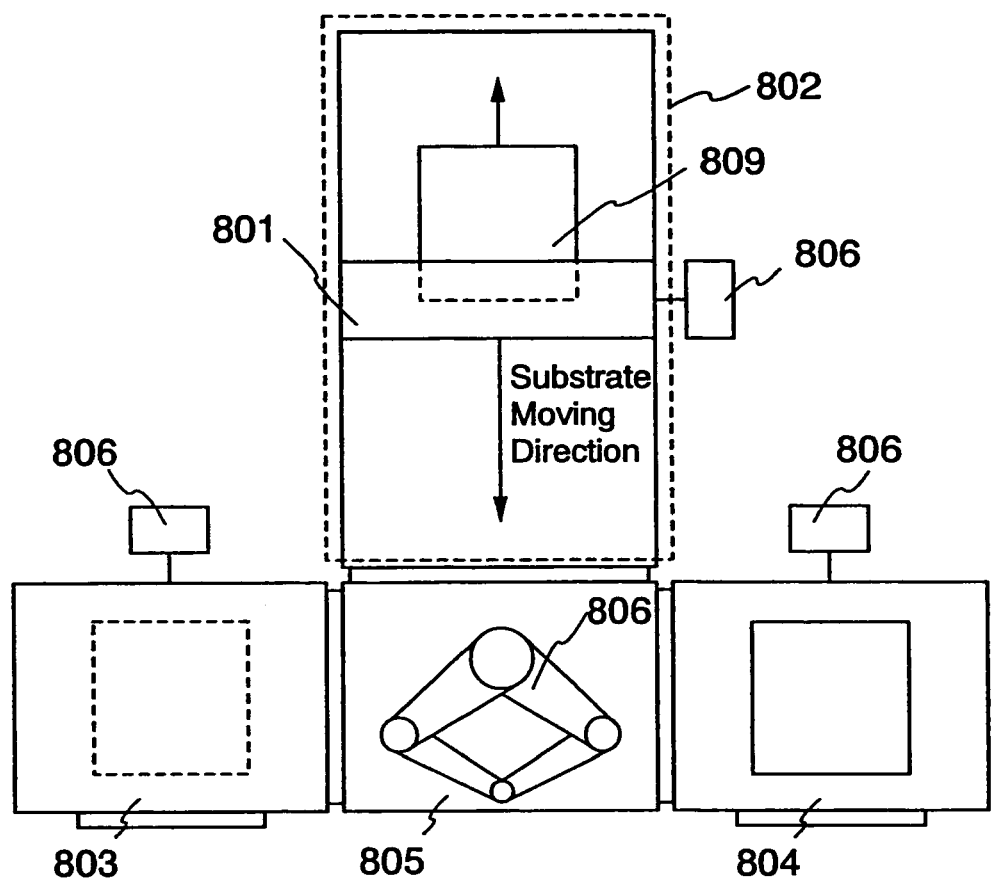
FIGS. 8A and 8B are a view showing a doping device.
Figure 8B:
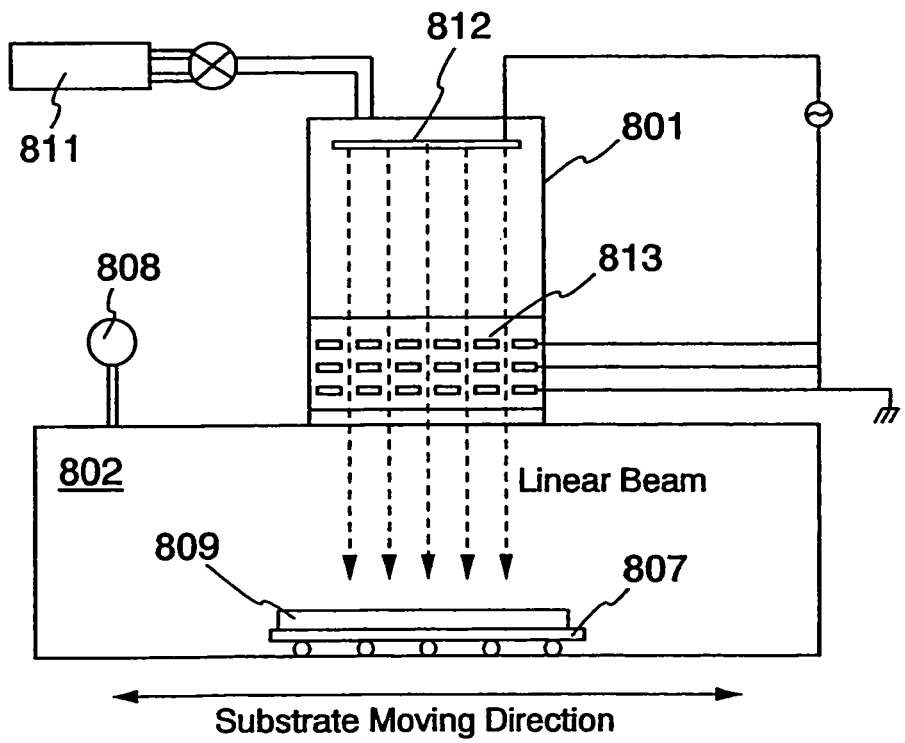

A doping device used in the present invention will be described reference to FIG. 8 in this embodiment mode. FIG. 8A is a view showing a top-surface of the doping device. FIG. 8B is a cross-sectional view of a doping chamber included in the doping device.

Main constitutions of the doping device are: a treatment chamber 802 having ion source 801; a load lock chamber (1) 803; a load lock chamber (2) 804; a transporting chamber 805; and an air displacement pump 806. The treatment chamber 802 is a place for infecting ion while moving alternately a substrate in the direction of the arrow shown in FIG. 8A and has a substrate stage 807 and a pressure gauge 808.

Transportation of a substrate is start from the load lock chambers (1) 803 and (2) 804 into the treatment chamber 802 by an arm 810 provided with the transporting chamber 805, or start from the treatment chamber 802 into the load lock chambers (1) 803 and (2) 804.

The treatment chamber 802 and the transporting chamber 805 are constantly kept vacuum by the air displacement pump 806 whereas the load lock chambers (1) 803 and (2) 804 are discharged to the atmosphere for taking a substrate in and out and subsequently kept vacuum by the air displacement pump 806. A dry pump, a mechanical booster pump, a turbo molecular pump, or the like can be used by combining appropriately themselves as the air displacement pump 806.

In the treatment chamber shown in FIG. 8B, the ion source 801 is provided with a gas supplying system 811 for supplying gas including doping elements (hereinafter, doping gas) and a discharge electrode 812 for forming plasma An accelerating unit 813 is provided with electrodes such as a leading out electrode (a leading out electrode, an accelerating electrode, a suppressing electrode, and an earth electrode). A great number of openings are provided to these electrodes and ions are passing through the openings. Ions are accelerated by the leading out electrode that is applied with leading out voltage and an accelerated electrode that is applied with accelerated voltage. The suppressing electrode enhances the direction of the flow of ions by collecting dispersed ions.

$PH_3$, $B_2H_6$, or the like is used as doping gas and diluted to approximately from 1 to 20% with hydrogen and inert gas. In case of using $PH_3$, $PH_x^+$, $P_2H_x^+$, $H_x^+$, or the like is generated as ion species, these ions are leaded out in the direction of the substrate by accelerating by the electrodes such as leading out electrodes in case of without mass separation. Ions are leaded out linearly as indicated by arrows in FIG. 8B by the electrode in the accelerating unit 813 and irradiated on the substrate.

A substrate 809 that is transported into the treatment chamber 802 is provided with the resist that is for adding impurity elements to a desired position as described in Embodiment Mode 2. Further stable doping can be realized by adding n-type or p-type impurity elements to the substrate.

Embodiment Mode 4

In case of manufacturing a plurality of TFT is formed in the pixel portion of a semiconductor apparatus, a mask pattern formed of resist that is used for adding n-type impurity elements and p-type impurity elements will be described in Embodiment Mode 4.

Figure 9A:
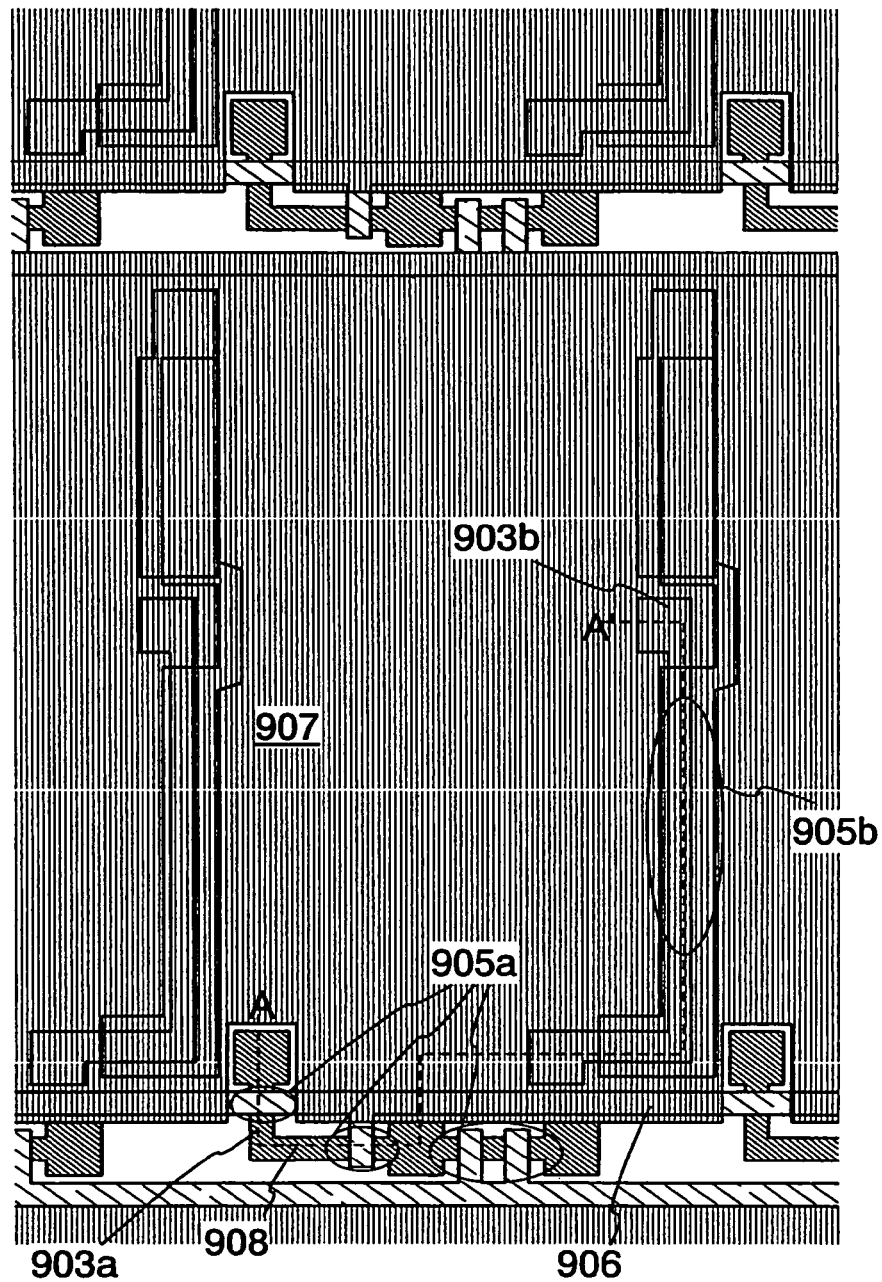
FIGS. 9A and 9B are a view showing a mask shape according to Embodiment Mode.
Figure 9B:
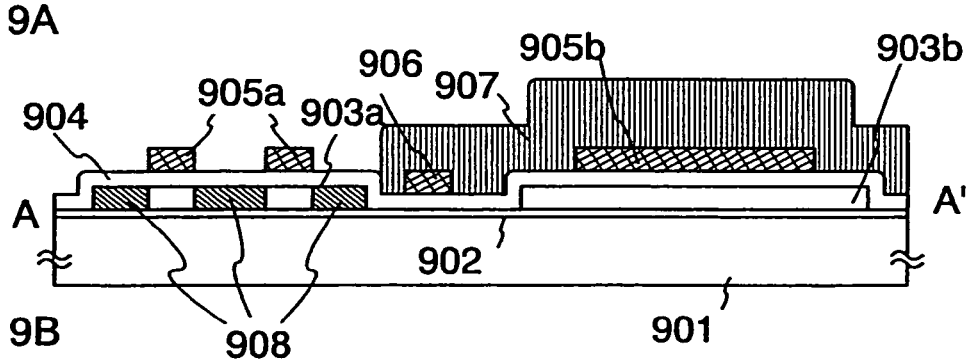

FIG. 9A is a view showing a top-surface of a pixel portion over a substrate on which a mask pattern is formed for adding n-type impurity elements. FIG. 9B is a cross-sectional view of FIG. 9A taken along the line of A-A'.

As shown in FIGS. 9A and 9B, a mask for adding an n-type impurity element 907 is formed by covering a semiconductor films 903a, a semiconductor film 903b formed over a substrate 901, a gate electrode 905b, and a gate signal line 906.

In the semiconductor film 903a, an n-type impurity region 908 can be formed in the portion where the gate electrode 905 is not overlapped by adding n-type impurity elements by the doping device described in Embodiment Mode 3.

In case of adding n-type impurity elements by ion implantation, phosphorus (dose amounts of $2 \times 10^{15}/cm^2$) is doped under the conditions, that is, $PH_3$ of 20% is used as impurity gas; the current density of 15 μA/cm$^2$; and the acceleration voltage of 60 kV. As shown in FIGS. 9A and 9B, the mask for adding n-type impurity element 907 is formed not only over the semiconductor film 903b but also over the gate signal line 906 and a part of the gate insulating film 904, however, there is no problem since the amount of degassed gas does not give adverse effects to the stability of doping in case of doping under such conditions of the current density and the acceleration voltage. In this case, the area proportions of the mask for adding n-type impurity element 907 to the whole substrate is 40%. The degasification can be suppressed if the area proportions of the mask for adding n-type impurity element 907 are reduced.

In case that light generated in a device formed in a pixel portion is emitted from a substrate, it is not preferable that unnecessary impurities are doped into the portion where pixels are formed in the following process since that will cause the problems of deterioration in transmittance.

After completing the phosphorus implantation, the mask for adding n-type impurity element 907 is peeled off by ashing. The ashing is carried out in oxygen plasma and the resist is peeled off for from 30 to 45 minutes.

Figure 10A:
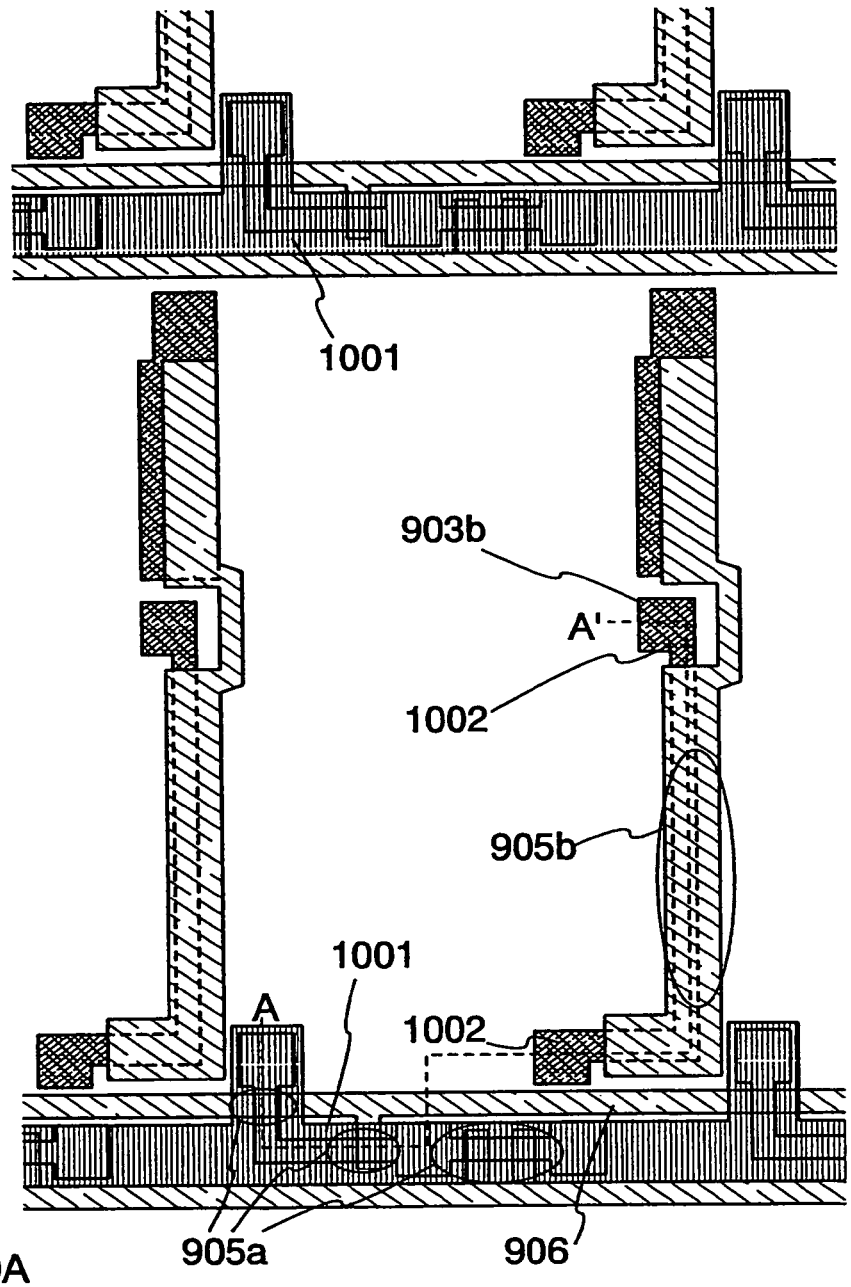
FIGS. 10A and 10B are a view showing a mask shape according to Embodiment Mode.
Figure 10B:
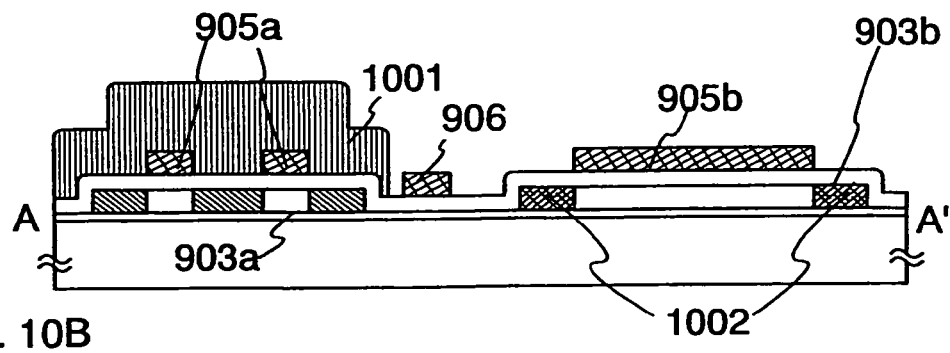

Next, a mask is formed as shown in FIGS. 10A and 10B, and p-type impurity elements are doped. FIG. 10A is a view showing a top-surface of a pixel portion over a substrate on which a mask pattern is formed for adding p-type impurity elements. FIG. 10B is a cross-sectional view of FIG. 10A taken along the line of A-A'. Through FIG. 10, like components are denoted by like numerals as of FIG. 9.

As shown in FIG. 10A, a mask for adding p-type impurity element 1001 is formed overlapping with the semiconductor film 903a, the gate electrode 905a, and a part of the gate signal line 906 that are formed on the substrate 901.

By adding p-type impurity elements by the doping device described in Embodiment Mode 2, a p-type impurity region 1002 can be formed in the semiconductor film 903b except the region where the gate electrode is not overlapped.

Further, in case of adding p-type impurity elements by ion implantation, boron (dose amounts of $8 \times 10^{15}/cm^2$) is implanted under the conditions, that is, $B_2H_6$ of 15% is used as impurity gas; the current density of 10 μA/cm²; and acceleration voltage of 80 kV. In case of FIGS. 10A and 10B, the mask for adding p-type impurity element 1001 is formed overlapping only the semiconductor film 903a so as to control the area proportions of the mask to be small as much as possible in FIGS. 9A and 9B. The reason of that is the conditions of the current density and the acceleration voltage for adding p-type impurity elements cause a great deal of degasification and affect adversely on the stability of the doping compared with adding n-type impurity elements.

Although in case of adding n-type impurity elements the resist area proportions are designed to be comparatively large in view of decrease in the transmittance due to unnecessary impurities, in case of adding p-type impurity elements the resist area proportions are designed to be comparatively small since there are large adverse effects of degasification on the doping. In this case, the area proportions of the mask for adding p-type impurity element 1001 to the whole substrate are 7%. The degasification can be suppressed if the area proportions of the mask for adding p-type impurity element 907 are reduced.

After completing the phosphorus implantation, the mask for adding p-type impurity element 1001 is peeled off by ashing. The ashing is carried out in oxygen plasma and the resist can be peeled off for from 30 to 45 minutes.

Figure 11A:
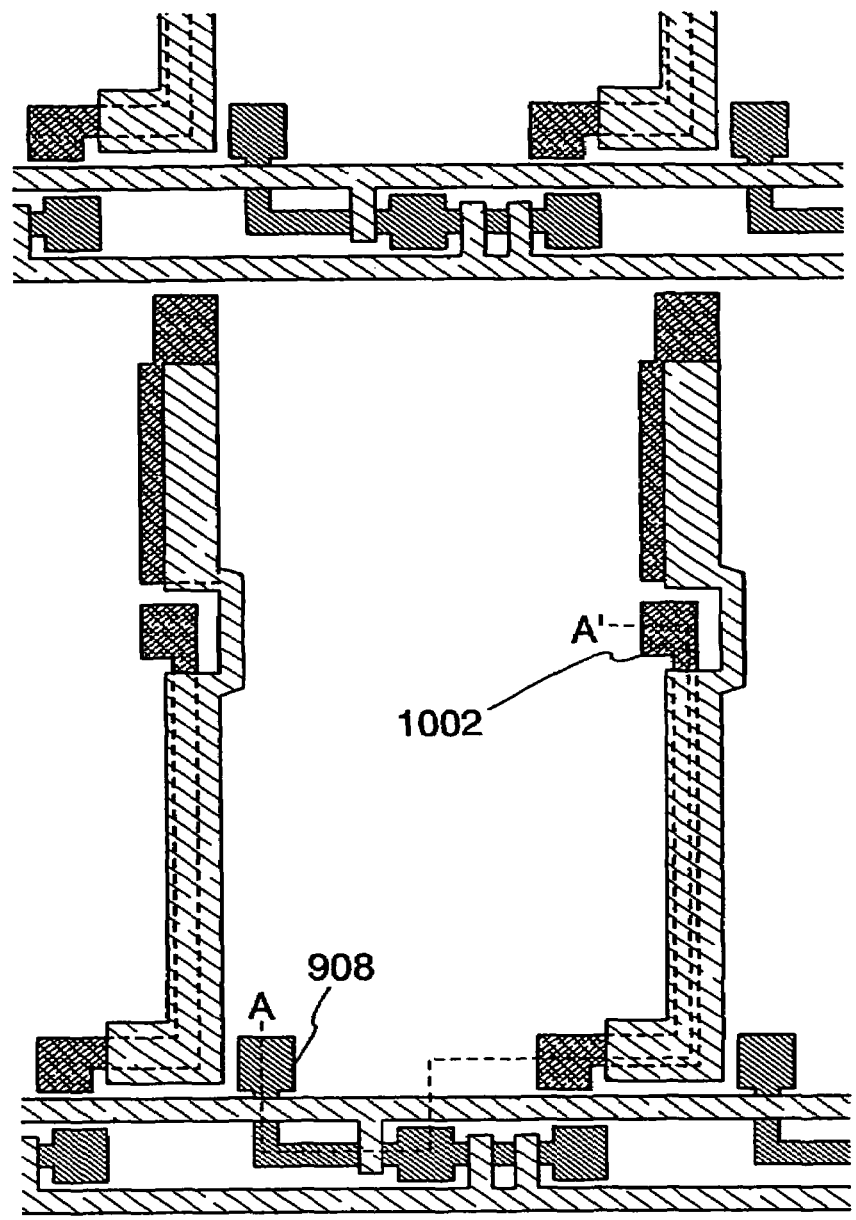
FIGS. 11A and 11B are a view showing a condition after carrying out doping.
Figure 11B:
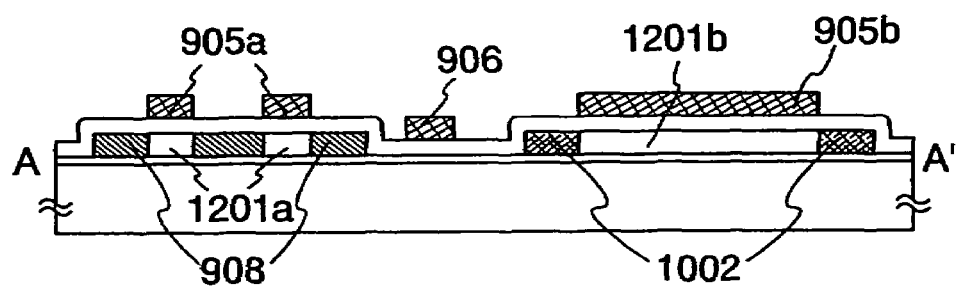

FIG. 11 is a view of a substrate on which the mask for adding p-type impurity element 1001 is removed, and each n-type impurity elements and p-type impurity elements are doped into the desired portion. An n-channel TFT and a p-channel TFT that are controlled sufficiently the amount of doped impurities can be manufactured over one substrate by combining the process described in Embodiment Mode 1 after forming each the n-type impurity region 908 and the p-type impurity region 1002 in the pixel portion of the semiconductor apparatus since prevention of the degasification and the stable doping can be realized by using the mask pattern described in this embodiment mode.

Among TFTs formed in the pixel portion, an n-channel TFT functions as a switching TFT and an erasing TFT, and a p-channel TFT functions as a current controlling TFT. Either the p-type impurity regions of the p-channel TFT connects electrically to a pixel electrode formed in the following process.

Embodiment Mode 5

A light-emitting apparatus having a light-emitting device in a pixel portion among semiconductor apparatuses manufactured by a method for doping according to the present invention will be described in Embodiment Mode 5 with reference to FIG. 12. FIG. 12A is a view showing a top surface of a light-emitting apparatus. FIG. 12B is a cross-sectional view of FIG. 12A taken along the line A-A'. Reference numeral 1201 denotes a driver circuit portion (a source side driver circuit); 1202, pixel portion; 1203, a driver circuit portion (a gate side driver circuit); 1204, a sealing substrate; and 1205, a sealant. Reference numeral 1207 encircled by the sealant 1205 is a space.

Reference numeral 1208 denotes a lead wiring for transmitting signals inputted to the source side driver circuit 1201 and the gate side driver circuit 1202. The lead wiring 1208 receives a video signal a clock signal, a start signal, a reset signal, or the like from a FPC (flexible printed circuit) 1209 serving as an external input terminal. Although only the FPC 1209 is illustrated here, a printed wiring board (PWB) is attached to the FPC 1209. The light-emitting apparatus descried in this specification includes not only a main body of a light-emitting apparatus but also a light-emitting apparatus attached with a FPC or a PWB.

Next, a cross-sectional structure will be described with reference to FIG. 12B. A driver circuit portion and a pixel portion are formed over a device substrate 1210. The source side driver circuit 1201 that is the driver circuit portion and the pixel portion 1210 are illustrated in FIG. 12B.

An n-channel TFT 1223 and a p-channel TFT 1224 are combined for forming a CMOS circuit as the source side driver circuit 1201. A TFT for forming a driver circuit portion may be formed by a known CMOS circuit, PMOS circuit, or NMOS circuit. In this embodiment mode, a driver-integrated type in which a driver circuit is formed over a substrate is illustrated, but not exclusively, the driver circuit can be formed exteriorly.

Further, the pixel portion 1202 is formed of a plurality of pixel including a switching TFT 1211, a current control TFT 1212, and a pixel electrode 1213 connected electrically to the drain of the current control TFT 1212. An insulator 1214 is formed by covering the edge portion of the pixel electrode 1213. Here, the insulator 1214 is formed by using a positive type acrylic resin film.

In order to improve the deposition, the upper edge portion or the lower edge portion of an insulator 1214 is formed to have a curved surface having radius of curvature. For example, in case of using a positive type acrylic resin film, it is preferable that only an upper edge portion of the insulator 1214 has a curved surface having a radius of curvature (from 0.2 to 3 μm). As a material for forming the insulator 1214, either a negative type that become an insoluble material in etchant according to light to which photosensitive material is exposed or a positive type that become a dissoluble material in etchant according to light to which photosensitive material is exposed can be used.

Each an electroluminescent layer 1216 and a counter electrode 1217 is formed over the pixel electrode 1213. As a material for forming the pixel electrode 1213 serving as an anode, a material having large work function is preferable. For example, in addition to a single layered film such as an ITO (indium tin oxide) film, an IZO (indium zinc oxide) film, a titanium nitride film, a chrome film, a tungsten film, a Zn fm, a Pt film, a lamination layered film stacked with a film containing titanium nitride and aluminum as its main component, three layered film of a titanium nitride film, a film containing aluminum as its main component, and a titanium nitride film, or the like can be used as the pixel electrode. In case of forming the anode to have a lamination structure, the electrode can be formed to have a low resistance as a wiring, have a good ohmic contact, and function as an anode.

The electroluminescent layer 1216 is formed by vapor deposition using an evaporation mask or ink jetting. As a material for forming the electroluminescent layer 1216, a low molecular material or a polymer material can be used Generally, there are many cases that an organic compound is used as a single layer or a lamination layer, however, the structure in which an inorganic compound is used as a part of a film composed of an organic compound is included in the present invention. Moreover, a known triplet material can be included.

As a material for forming the counter electrode (cathode) 1217 formed over the electroluminescent layer 1216, a material having small work function (Al, Ag, Li, Ca, or alloy of these elements such as MgAg, MgIn, AlLi, $CaF_2$, or CaN) can be used. In case that light generated in the electroluminescent layer 1216 is emitted through the counter electrode 1217, a lamination of a metal thin film formed to have a thin thickness and a transparent conductive film (ITO (indium tin oxide), alloy of indium zinc oxide ($In_2O_3$—ZnO), zinc oxide (ZnO), or the like) can be used as the counter electrode 1217.

A light-emitting device 1218 is formed in the space encircled by the device substrate 1210, the sealing substrate 1204, and the sealant 1205 by bonding the sealing substrate 1204 to the device substrate 1210 with the sealant 1205. The space 1207 is filled with inert gas (nitride, argon, or the like) or the sealant 1205.

It is preferable to use epoxy resin as the sealant 1205. In addition, it is desired that these materials inhabit moisture and oxygen as much as possible. As a material for forming the sealing substrate 1204, a plastic substrate formed of FRP (Fiberglass-Reinforced Plastics), PVF (polyvinyl fluoride), Myler, polyester, acrylic, or the like be used in addition to a glass substrate or a quartz substrate.

Accordingly, a light-emitting apparatus that has a TFT as one of the components fabricated by using the doping method according to the present invention can be manufactured.

Embodiment Mode 5 can be implemented by freely combining with the structures described in Embodiment Modes 2 to 4.

Embodiment Mode 6

Various electric appliances manufactured by using a semiconductor apparatus having a TFT manufactured by the doping method according to the present invention will be described in Embodiment Mode 6.

Given as examples of electric appliances employing a semiconductor apparatus fabricated by the doping method according to the present invention are: a video camera; a digital camera; a goggle type display (head mounted display); a navigation system; an audio reproducing device (car audio, an audio component, etc.); a laptop computer; a game machine; a portable information terminal (a mobile computer, a cellular phone, a portable game machine, an electronic book, etc.); and an image reproducing device (specifically, a device that is equipped with a display device for reproducing data in a recording medium such as a digital versatile disk (DVD)). Specific examples of the electric appliances are shown in FIGS. 13A to 13H.

Figure 13A:
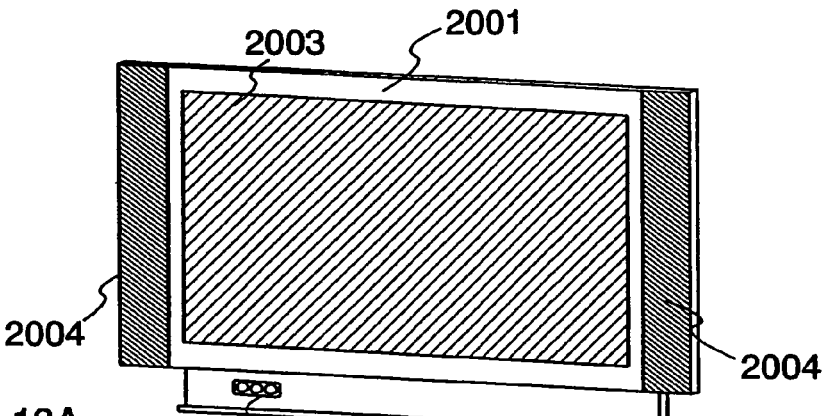
FIGS. 13A to 13G are a view showing electric appliances.

FIG. 13A shows a display device, which comprises a casing 2001, a supporting base 2002, a display unit 2003, speaker units 2004, a video input terminal 2005, etc. The display device can be completed by using the semiconductor apparatus having the TFT fabricated by the doping method according to the present invention as the display unit 2003. The term display device includes all of the display devices for displaying information such as one for a personal computer, one for receiving TV broadcasting, and one for advertisement. And the size of the display can be no less than 4 inches.

Figure 13B:
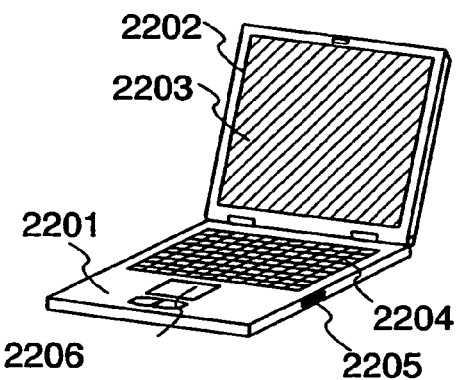

FIG. 13B shows a laptop computer, which comprises a main body 2201, a casing 2202, a display unit 2203, a keyboard 2204, an external connection port 2205, a pointing mouse 2206, etc. The laptop computer can be completed by using the semiconductor apparatus having the TFT fabricated by the doping method according to the present invention as the display unit 2203.

Figure 13C:
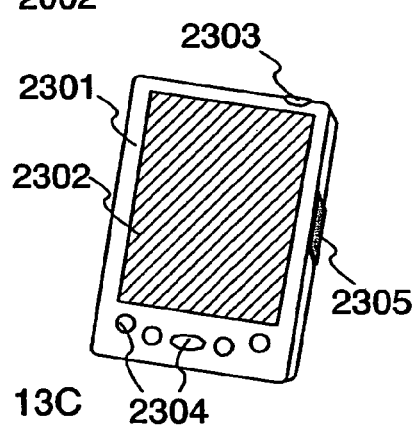

FIG. 13C shows a mobile computer, which comprises a main body 2301, a display unit 2302, a switch 2303, operation keys 2304, an infrared ray port 2305, etc. The mobile computer can be completed by using the semiconductor apparatus having the TFT fabricated by the doping method according to the present invention as the display unit 2302.

Figure 13D:
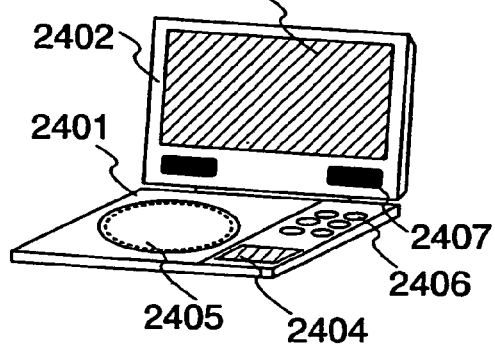

FIG. 13D shows a portable image-reproducing device equipped with a recording medium (a DVD player, to be specific). The device comprises a main body 2401, a casing 2402, a display unit A 2403, a display unit B 2404, a recording medium (DVD, or the like) reading unit 2405, operation keys 2406, speaker units 2407, etc. The display unit A 2403 mainly displays image information whereas the display unit B 2404 mainly displays text information. The portable image reproducing device can be completed by using the semiconductor apparatus having the TFT fabricated by the doping method according to the present invention as the display units A 2403 and B 2404. The term image-reproducing device equipped with a recording medium includes video game machines.

Figure 13E:
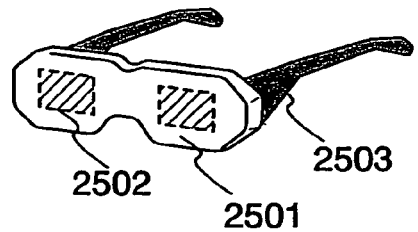

FIG. 13E shows a goggle type display (head mounted display), which comprises a main body 2501, display units 2502, and arm units 2503. The mobile computer can be completed by using the semiconductor apparatus having the TFT fabricated by the doping method according to the present invention as the display units 2502.

Figure 13F:
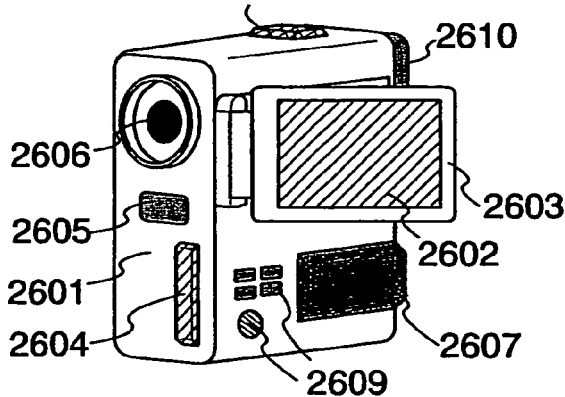
Figure 13G:
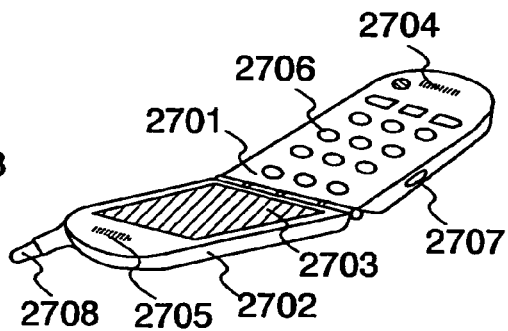

FIG. 13F shows a video camera, which comprises a main body 2601, a display unit 2602, a casing 2603, an external connection port 2604, a remote control receiving unit 2605, an image receiving unit 2606, a battery 2607, an audio input unit 2608, operation keys 2609, an eye piece 2610, etc. The video camera can be completed by using the semiconductor apparatus having the TFT fabricated by the doping method according to the present invention as the display unit 2602.

FIG. 13H shows a cellular phone, which comprises a main body 2701, a casing 2702, a display unit 2703, an audio input unit 2704, an audio output unit 2705, operation keys 2706, an external connection port 2707, an antenna 2708, etc. The video camera can be completed by using the semiconductor apparatus having the TFT fabricated by the doping method according to the present invention as the display unit 2703. If the display unit 2703 displays white characters on a black background, power consumption of the cellular phone can be reduced.

As above described, the application range of the semiconductor apparatus having the TFT fabricated by the doping method according to the present invention is extremely wide so that the semiconductor apparatus can be applied to electric appliances in every field.

In the present invention, the stable doping without the drastic pressure change in a treatment chamber can be realized by reducing degasification of resist during doping by means of reducing area proportions of a mask, which is formed of resist and which is used for doping, to be smaller than the conventional one.

What is claimed is:

1. A semiconductor apparatus comprising:
   at least one n-channel TFT formed in a pixel over a substrate, the n-channel TFT comprising a first island like semiconductor including an n-type impurity in source and drain regions thereof;
   at least one p-channel TFT formed in the pixel over the substrate, the p-channel TFT comprising a second island like semiconductor including an p-type impurity in source and drain regions thereof;
   an insulating film formed over the substrate to cover the first island like semiconductor and the second island like semiconductor;
   a gate electrode formed to overlap a portion of the first island like semiconductor and a portion of the second island like semiconductor via the insulating film; and
   a gate signal line provided between the first and second island like semiconductors,
   wherein an area of the insulating film which is added with the p-type impurity is larger than an area of the insulating film which is added with the n-type impurity, wherein a portion of the insulating film located between the gate signal line and the first island like semiconductor contains the p-type impurity, and wherein a portion of the insulating film located between the gate signal line and the second island like semiconductor contains the p-type impurity.

2. A semiconductor apparatus according to claim 1, wherein an area of the substrate is no less than 1 square meter.

3. A semiconductor apparatus according to claim 1, wherein the n-channel TFT and the p-channel TFT are combined to form a CMOS circuit.

4. A semiconductor apparatus according to claim 1, wherein the insulating film is a silicon oxynitride film which is formed of $SiH_4$ and $N_2O$ added with $O_2$.

5. A semiconductor apparatus according to claim 1, wherein the gate electrode of the n-channel TFT is added with the n-type impurity and the p-type impurity.

6. A display device including a pixel portion comprising a plurality of pixels, comprising:

at least one n-channel TFT formed in one of the pixels over a substrate, the n-channel TFT comprising a first island like semiconductor including an n-type impurity in source and drain regions thereof;

at least one p-channel TFT formed in the one of the pixels over the substrate, the p-channel TFT comprising a second island like semiconductor including a p-type impurity in source and drain regions thereof;

an insulating film formed over the substrate to cover the first island like semiconductor and the second island like semiconductor;

a gate electrode formed to overlap a portion of the first island like semiconductor and a portion of the second island like semiconductor via the insulating film; and a gate signal line provided between the first and second island like semiconductors, wherein a part of the pixel portion contains an n-type impurity element and a p-type impurity element, wherein an area of the insulating film which is added with the p-type impurity is larger than an area of the insulating film which is added with the n-type impurity, wherein a portion of the insulating film located between the gate signal line and the first island like semiconductor contains the p-type impurity, and wherein a portion of the insulating film located between the gate signal line and the second island like semiconductor contains the p-type impurity.

7. A display device according to claim 6 wherein a ratio of the part of the pixel portion containing impurity element to the pixel portion is no less than 80%.

8. A display device according to claim 6, wherein an area of the substrate is no less than 1 square meter.

9. A display device according to claim 6, wherein the insulating film is a silicon oxynitride film which is formed of $SiH_4$ and $N_2O$ added with $O_2$.

10. A display device according to claim 6, wherein the pixel portion comprises an electroluminescent layer.

11. A display device according to claim 6, wherein the n-channel TFT and the p-channel TFT are combined for forming a CMOS circuit.

12. A display device according to claim 6, wherein the gate electrode of the n-channel TFT is added with the n-type impurity and the p-type impurity.

13. A semiconductor device comprising:

at least one n-channel TFT formed over a substrate, the n-channel TFT comprising a first island like semiconductor including an n-type impurity in source and drain regions thereof, at least one p-channel TFT formed over the substrate, the p-channel TFT comprising a second island like semiconductor including a p-type impurity in source and drain regions thereof, an insulating film formed over the substrate, the insulating film covering at least the first island like semiconductor, the second island semiconductor and a portion of the substrate between the first and second island like semiconductors; and a gate signal line provided between the first and second island like semiconductors, wherein an area of the insulating film which is added with the p-type impurity is larger than an area of the insulating film which is added with the n-type impurity, wherein a portion of the insulating film located between the gate signal line and the first island like semiconductor contains the p-type impurity, and wherein a portion of the insulating film located between the gate signal line and the second island like semiconductor contains the p-type impurity.

14. A semiconductor device according to claim 13, wherein an area of the substrate is no less than 1 square meter.

15. A semiconductor device according to claim 13, wherein the n-channel TFT and the p-channel TFT are combined to form a CMOS circuit.

16. A semiconductor device according to claim 13, wherein the insulating film is a silicon oxynitride film which is formed of $SiH_4$ and $N_2O$ added with $O_2$.

17. A semiconductor device according to claim 13, wherein the gate electrode of the n-channel TFT is added with the n-type impurity and the p-type impurity.

18. A semiconductor device according to claim 13, wherein the portion of the insulating film located between the first and second island like semiconductors contains the p-type impurity at a higher concentration than the n-type impurity.

* * * * *